United States Patent
Rattan et al.

(10) Patent No.: US 11,502,658 B2
(45) Date of Patent: Nov. 15, 2022

(54) AMPLIFIER WITH ADJUSTABLE HIGH-FREQUENCY GAIN USING VARACTOR DIODES

(71) Applicant: Kandou Labs SA, Lausanne (CH)

(72) Inventors: Suhas Rattan, London (GB); Kiarash Gharibdoust, Lonay (CH)

(73) Assignee: KANDOU LABS, S.A., Lausanne (CH)

( * ) Notice: Subject to any disclaimer, the term of this patent is extended or adjusted under 35 U.S.C. 154(b) by 83 days.

(21) Appl. No.: 17/183,100

(22) Filed: Feb. 23, 2021

(65) Prior Publication Data

US 2021/0175867 A1 Jun. 10, 2021

Related U.S. Application Data

(63) Continuation of application No. 16/378,461, filed on Apr. 8, 2019, now Pat. No. 10,931,249.

(60) Provisional application No. 62/683,964, filed on Jun. 12, 2018.

(51) Int. Cl.
| | |
|---|---|
| H03F 3/45 | (2006.01) |
| H03G 3/30 | (2006.01) |
| H03M 1/66 | (2006.01) |
| H03F 3/72 | (2006.01) |

(52) U.S. Cl.
CPC ....... *H03G 3/3026* (2013.01); *H03F 3/45071* (2013.01); *H03F 3/72* (2013.01); *H03M 1/66* (2013.01)

(58) Field of Classification Search
CPC ...... H03G 3/3026; H03F 3/45071; H03F 3/72
See application file for complete search history.

(56) References Cited

U.S. PATENT DOCUMENTS

| | | | |
|---|---|---|---|
| 3,636,463 | A | 1/1972 | Ongkiehong |
| 3,824,494 | A | 7/1974 | Wilcox |
| 3,939,468 | A | 2/1976 | Mastin |
| 4,276,543 | A | 6/1981 | Miller et al. |
| 4,774,498 | A | 9/1988 | Traa |
| 4,897,657 | A | 1/1990 | Brubaker |
| 5,017,924 | A | 5/1991 | Guiberteau et al. |
| 5,459,465 | A | 10/1995 | Kagey |
| 5,510,736 | A | 4/1996 | Van |
| 5,748,948 | A | 5/1998 | Yu et al. |
| 5,777,568 | A | 7/1998 | Inoue |

(Continued)

FOREIGN PATENT DOCUMENTS

| | | |
|---|---|---|
| CN | 104242839 A | 12/2014 |
| EP | 0425064 A2 | 5/1991 |

(Continued)

OTHER PUBLICATIONS

Bae, Joonsung, et al., "Circuits and Systems for Wireless Body Area Network", Electromagnetics of Body-Area Networks: Antennas, Propagation, and RF Systems, First Edition, 2016, 375-403 (29 pages).

(Continued)

*Primary Examiner* — Patricia T Nguyen
(74) *Attorney, Agent, or Firm* — Invention Mine LLC

(57) ABSTRACT

The detection matrix for an Orthogonal Differential Vector Signaling code is typically embodied as a transistor circuit with multiple active signal inputs. An alternative detection matrix approach uses passive resistor networks to sum at least some of the input terms before active detection.

20 Claims, 9 Drawing Sheets

(56) References Cited

U.S. PATENT DOCUMENTS

| | | |
|---|---|---|
| 5,793,254 A | 8/1998 | Oconnor |
| 5,945,935 A | 8/1999 | Kusumoto et al. |
| 6,094,075 A | 7/2000 | Garrett et al. |
| 6,226,330 B1 | 5/2001 | Mansur |
| 6,232,908 B1 | 5/2001 | Nakaigawa |
| 6,343,024 B1* | 1/2002 | Zabroda .......... H04L 25/0266 323/208 |
| 6,346,907 B1 | 2/2002 | Dacy et al. |
| 6,384,758 B1 | 5/2002 | Michalski et al. |
| 6,396,329 B1 | 5/2002 | Zerbe |
| 6,400,302 B1 | 6/2002 | Amazeen et al. |
| 6,462,584 B1 | 10/2002 | Proebsting |
| 6,546,063 B1 | 4/2003 | Lee et al. |
| 6,563,382 B1 | 5/2003 | Yang |
| 6,624,699 B2 | 9/2003 | Yin et al. |
| 6,838,951 B1 | 1/2005 | Nieri et al. |
| 6,839,587 B2 | 1/2005 | Yonce |
| 6,879,816 B2 | 4/2005 | Bult et al. |
| 6,888,483 B2 | 5/2005 | Mulder |
| 6,972,701 B2 | 12/2005 | Jansson |
| 7,075,996 B2 | 7/2006 | Simon et al. |
| 7,167,523 B2 | 1/2007 | Mansur |
| 7,188,199 B2 | 3/2007 | Leung et al. |
| 7,199,728 B2 | 4/2007 | Dally et al. |
| 7,269,212 B1 | 9/2007 | Chau et al. |
| 7,285,977 B2 | 10/2007 | Kim |
| 7,372,295 B1 | 5/2008 | Wei |
| 7,372,390 B2 | 5/2008 | Yamada |
| 7,397,302 B2 | 7/2008 | Bardsley et al. |
| 7,528,758 B2 | 5/2009 | Ishii |
| 7,560,957 B2 | 7/2009 | Chen et al. |
| 7,598,811 B2 | 10/2009 | Cao |
| 7,635,990 B1 | 12/2009 | Ren et al. |
| 7,656,321 B2 | 2/2010 | Wang |
| 7,683,720 B1 | 3/2010 | Yehui et al. |
| 7,688,102 B2 | 3/2010 | Bae et al. |
| 7,688,887 B2 | 3/2010 | Gupta et al. |
| 7,697,915 B2 | 4/2010 | Behzad et al. |
| 7,804,361 B2 | 9/2010 | Lim et al. |
| 7,822,113 B2 | 10/2010 | Tonietto et al. |
| 7,839,229 B2 | 11/2010 | Nakamura et al. |
| 7,957,472 B2 | 6/2011 | Wu et al. |
| 8,000,664 B2 | 8/2011 | Khorram |
| 8,030,999 B2 | 10/2011 | Chatterjee et al. |
| 8,106,806 B2 | 1/2012 | Toyomura et al. |
| 8,159,375 B2 | 4/2012 | Abbasfar |
| 8,159,376 B2 | 4/2012 | Abbasfar |
| 8,183,930 B2 | 5/2012 | Kawakami et al. |
| 8,537,886 B1 | 9/2013 | Shumarayev et al. |
| 8,547,272 B2 | 10/2013 | Nestler et al. |
| 8,581,824 B2 | 11/2013 | Baek et al. |
| 8,604,879 B2 | 12/2013 | Mourant et al. |
| 8,643,437 B2 | 2/2014 | Chiu et al. |
| 8,674,861 B2 | 3/2014 | Matsuno et al. |
| 8,687,968 B2 | 4/2014 | Nosaka et al. |
| 8,704,583 B2 | 4/2014 | Bulzacchelli et al. |
| 8,791,735 B1 | 7/2014 | Shibasaki |
| 8,841,936 B2 | 9/2014 | Nakamura |
| 8,860,590 B2 | 10/2014 | Kamagata et al. |
| 8,861,583 B2 | 10/2014 | Liu |
| 9,069,995 B1 | 6/2015 | Cronie |
| 9,106,462 B1 | 8/2015 | Aziz et al. |
| 9,106,465 B2 | 8/2015 | Walter |
| 9,148,087 B1 | 9/2015 | Tajalli |
| 9,178,503 B2 | 11/2015 | Hsieh |
| 9,281,785 B2 | 3/2016 | Sjöland |
| 9,281,974 B1 | 3/2016 | Liu |
| 9,292,716 B2 | 3/2016 | Winoto et al. |
| 9,300,503 B1 | 3/2016 | Holden et al. |
| 9,705,708 B1 | 7/2017 | Jin et al. |
| 9,743,196 B2* | 8/2017 | Kropfitsch .......... H04R 19/04 |
| 9,755,599 B2 | 9/2017 | Yuan et al. |
| 9,780,979 B2 | 10/2017 | Sun et al. |
| 9,954,495 B1 | 4/2018 | Chen et al. |
| 10,003,315 B2 | 6/2018 | Tajalli |
| 10,326,623 B1 | 6/2019 | Tajalli |
| 2001/0006538 A1 | 7/2001 | Simon et al. |
| 2002/0050861 A1 | 5/2002 | Nguyen et al. |
| 2002/0149508 A1 | 10/2002 | Hamashita |
| 2002/0158789 A1 | 10/2002 | Yoshioka et al. |
| 2002/0174373 A1 | 11/2002 | Chang |
| 2003/0016763 A1 | 1/2003 | Doi et al. |
| 2003/0085763 A1 | 5/2003 | Schrodinger et al. |
| 2003/0132791 A1 | 7/2003 | Hsieh |
| 2003/0160749 A1 | 8/2003 | Tsuchi |
| 2003/0174023 A1 | 9/2003 | Miyasita |
| 2003/0184459 A1 | 10/2003 | Engl |
| 2003/0218558 A1 | 11/2003 | Mulder |
| 2004/0027185 A1 | 2/2004 | Fiedler |
| 2004/0169529 A1 | 9/2004 | Afghani et al. |
| 2005/0008099 A1 | 1/2005 | Brown |
| 2005/0057379 A1 | 3/2005 | Jansson |
| 2005/0218980 A1 | 10/2005 | Kalb |
| 2005/0270098 A1 | 12/2005 | Zhang et al. |
| 2006/0036668 A1 | 2/2006 | Jaussi et al. |
| 2006/0097786 A1 | 5/2006 | Su et al. |
| 2006/0103463 A1 | 5/2006 | Lee et al. |
| 2006/0192598 A1 | 8/2006 | Baird et al. |
| 2006/0194598 A1 | 8/2006 | Kim et al. |
| 2007/0009018 A1 | 1/2007 | Wang |
| 2007/0097579 A1 | 5/2007 | Amamiya |
| 2007/0104299 A1 | 5/2007 | Cahn et al. |
| 2007/0146088 A1 | 6/2007 | Arai et al. |
| 2007/0159247 A1 | 7/2007 | Lee et al. |
| 2007/0176708 A1 | 8/2007 | Otsuka et al. |
| 2007/0182487 A1 | 8/2007 | Ozasa et al. |
| 2007/0188367 A1 | 8/2007 | Yamada |
| 2007/0201546 A1 | 8/2007 | Lee |
| 2007/0285156 A1 | 12/2007 | Roberts et al. |
| 2008/0001626 A1 | 1/2008 | Bae et al. |
| 2008/0107209 A1 | 5/2008 | Cheng et al. |
| 2008/0165841 A1 | 7/2008 | Wall et al. |
| 2008/0187037 A1 | 8/2008 | Bulzacchelli et al. |
| 2009/0090333 A1 | 4/2009 | Spadafora et al. |
| 2009/0115523 A1 | 5/2009 | Akizuki et al. |
| 2009/0146719 A1 | 6/2009 | Pernia et al. |
| 2009/0323864 A1 | 12/2009 | Tired |
| 2010/0033259 A1 | 2/2010 | Miyashita |
| 2010/0148819 A1 | 6/2010 | Bae et al. |
| 2010/0156691 A1 | 6/2010 | Taft |
| 2010/0219781 A1 | 9/2010 | Kuwamura |
| 2010/0235673 A1 | 9/2010 | Abbasfar |
| 2010/0271107 A1 | 10/2010 | Tran et al. |
| 2011/0028089 A1 | 2/2011 | Komori |
| 2011/0032977 A1 | 2/2011 | Hsiao et al. |
| 2011/0051854 A1 | 3/2011 | Kizer et al. |
| 2011/0057727 A1 | 3/2011 | Cranford et al. |
| 2011/0096054 A1 | 4/2011 | Cho et al. |
| 2011/0103508 A1 | 5/2011 | Mu et al. |
| 2011/0105067 A1* | 5/2011 | Wilson .......... H03G 1/0029 455/150.1 |
| 2011/0133816 A1 | 6/2011 | Wu et al. |
| 2011/0156819 A1 | 6/2011 | Kim et al. |
| 2012/0025911 A1 | 2/2012 | Zhao et al. |
| 2012/0044021 A1 | 2/2012 | Yeh et al. |
| 2012/0133438 A1 | 5/2012 | Tsuchi et al. |
| 2012/0200364 A1 | 8/2012 | Iizuka et al. |
| 2012/0249217 A1 | 10/2012 | Fukuda et al. |
| 2013/0106513 A1 | 5/2013 | Cyrusian et al. |
| 2013/0114663 A1 | 5/2013 | Ding et al. |
| 2013/0147553 A1 | 6/2013 | Iwamoto |
| 2013/0195155 A1 | 8/2013 | Pan et al. |
| 2013/0215954 A1 | 8/2013 | Beukema et al. |
| 2013/0259113 A1 | 10/2013 | Kumar |
| 2013/0334985 A1 | 12/2013 | Kim et al. |
| 2014/0119479 A1 | 5/2014 | Tajalli |
| 2014/0176354 A1 | 6/2014 | Yang |
| 2014/0177696 A1 | 6/2014 | Hwang |
| 2014/0203794 A1 | 7/2014 | Pietri et al. |
| 2014/0266440 A1 | 9/2014 | Itagaki et al. |
| 2014/0312876 A1 | 10/2014 | Hanson et al. |
| 2015/0070201 A1 | 3/2015 | Dedic et al. |
| 2015/0146771 A1 | 5/2015 | Walter |
| 2015/0198647 A1 | 7/2015 | Atwood et al. |

(56) References Cited

U.S. PATENT DOCUMENTS

| | | |
|---|---|---|
| 2016/0013954 A1 | 1/2016 | Shokrollahi et al. |
| 2016/0087610 A1 | 3/2016 | Hata |
| 2016/0197747 A1 | 7/2016 | Ulrich et al. |
| 2017/0085239 A1 | 3/2017 | Yuan et al. |
| 2017/0104458 A1 | 4/2017 | Cohen et al. |
| 2017/0214374 A1 | 7/2017 | Tajalli |
| 2017/0302237 A1 | 10/2017 | Akter et al. |
| 2017/0302267 A1 | 10/2017 | Luo |
| 2017/0309346 A1 | 10/2017 | Tajalli et al. |
| 2018/0076985 A1 | 3/2018 | Schell |
| 2019/0199557 A1 | 6/2019 | Taylor et al. |
| 2019/0221153 A1 | 7/2019 | Tsuchi et al. |
| 2019/0379563 A1 | 12/2019 | Tajalli et al. |
| 2020/0321778 A1 | 10/2020 | Gharibdoust et al. |
| 2021/0248103 A1 | 8/2021 | Khashaba et al. |

FOREIGN PATENT DOCUMENTS

| | | |
|---|---|---|
| WO | 2018052657 A1 | 3/2018 |
| WO | 2019241081 A1 | 12/2019 |

OTHER PUBLICATIONS

International Search Report and Written Opinion for PCT/US2019/036384, dated Aug. 1, 2019, 1-11 (11 pages).

Anadigm , "Using the Anadigm Multiplier CAM", Design Brief 208, www.anadigm.com, Copyright 2002, 2002, (6 pages).

Dickson, Timothy , et al., "A 1.8 pJ/bit 16x16 GB/s Source-Sychronous Parallel Interface in 32 nm SOR CMOS with Receiver Redundancy for Link Recalibration", IEEE Journal of Solid-State Circuits, vol. 51, No. 8, Jul. 8, 2016, 1744-1755 (12 pages).

Kim, Kyu-Young , et al., "8 mW 1.65-Gbps continuous-time equalizer with clock attenuation detection for digital display interface", Analog Integrated Circuits and Signal Processing, Kluwer Academic Publishers, vol. 63, No. 2, Oct. 11, 2009, 329-337 (9 pages).

Palmisano, G. , et al., "A Replica Biasing for Constant-Gain Cmos Open-Loop Amplifiers", Circuits and Systems, IEEE International Symposium in Monterey, CA, May 31, 1998, 363-366 (4 pages).

Schneider, J. , et al., "ELEC301 Project: Building an Analog Computer", http://www.clear.rice.edu/elec301/Projects99/anlgcomp/, Dec. 19, 1999, (9 pages).

Shekhar, S. , et al., "Design Considerations for Low-Power Receiver Front-End in High-Speed Data Links", Proceedings of the IEEE 2013 Custom Integrated Circuits Conference, Sep. 22, 2013, 1-8 (8 pages).

Takahashi, Masayoshi, et al., "A 2-GHz Gain Equalizer for Analog Signal Transmission Using Feedforward Compensation by a Low-Pass Filter", IEICE Transactions on Fundamentals of Electronics, vol. E94A, No. 2, Feb. 2011, 611-616 (6 pages).

Terzopoulos, Nikolaos , et al., "A 5-Gbps USB3.0 Transmitter and Receiver Liner Equalizer", International Journal of Circuit Theory and Applications, vol. 43, No. 7, Feb. 28, 2014, 900-916 (17 pages).

Tierney, J. , "A Digital Frequency Synthesizer", Audio and Electroacoustics, IEEE Transactions, pp. 48-57, vol. 19, No. 1, Abstract, Mar. 1971, (1 page).

Wang, Hui, et al., "Equalization Techniques for High-Speed Serial Interconnect Transceivers", Solid-State and Integrated-Circuit Technology, 9th International Conference on ICSICT, Piscataway, NJ, Oct. 20, 2008, 1-4 (4 pages).

\* cited by examiner

Tx Gate Version

AMPLIFIER WITH ADJUSTABLE HIGH-FREQUENCY GAIN USING VARACTOR DIODES

CROSS-REFERENCE TO RELATED APPLICATIONS

This application is a continuation of U.S. patent application Ser. No. 16/378,461, filed Apr. 8, 2019, naming Suhas Rattan, entitled "Amplifier with Adjustable High-Frequency Gain Using Varactor Diodes", which claims the benefit of U.S. Provisional Application No. 62/683,964, filed Jun. 12, 2018, naming Suhas Rattan, entitled "Amplifier with Adjustable High-Frequency Gain Using Varactor Diodes", all of which are hereby incorporated herein by reference in their entirety for all purposes.

BRIEF DESCRIPTION

An amplifier circuit incorporating configurable frequency compensation is described, suitable for use as a continuous-time linear equalizer (CTLE) for communications receiver input signals. Elements of the design facilitate compact circuit layout with the configurable elements closely integrated with the analog devices they control.

DETAILED DESCRIPTION

Continuous-time Linear Equalization (CTLE) circuits are well known in the art. One common design is based on a conventional differential amplifier circuit utilizing a matched transistor pair having individual source loads but common drain connections to a fixed current sink. Splitting the current sink into two, one for each transistor drain, allows the drains to be cross-coupled with a frequency-dependent impedance such as a parallel RC network, modifying the essentially flat gain-vs-frequency characteristic of the basic differential amplifier into one having distinctly different low- and high-frequency gains.

In communications system receivers, such a CTLE circuit is typically configured to provide increased high-frequency gain, to equalize or compensate for the inevitable high frequency loss of most communications media. In some embodiments, careful configuration of amplitude and equalization functions is performed to facilitate accurate signal detection and/or clock recovery by subsequent circuits. In some embodiments, a CTLE circuit in which both the gain characteristics and the frequency break points of such frequency-dependent compensation may be adjusted or configured.

Figure 1:
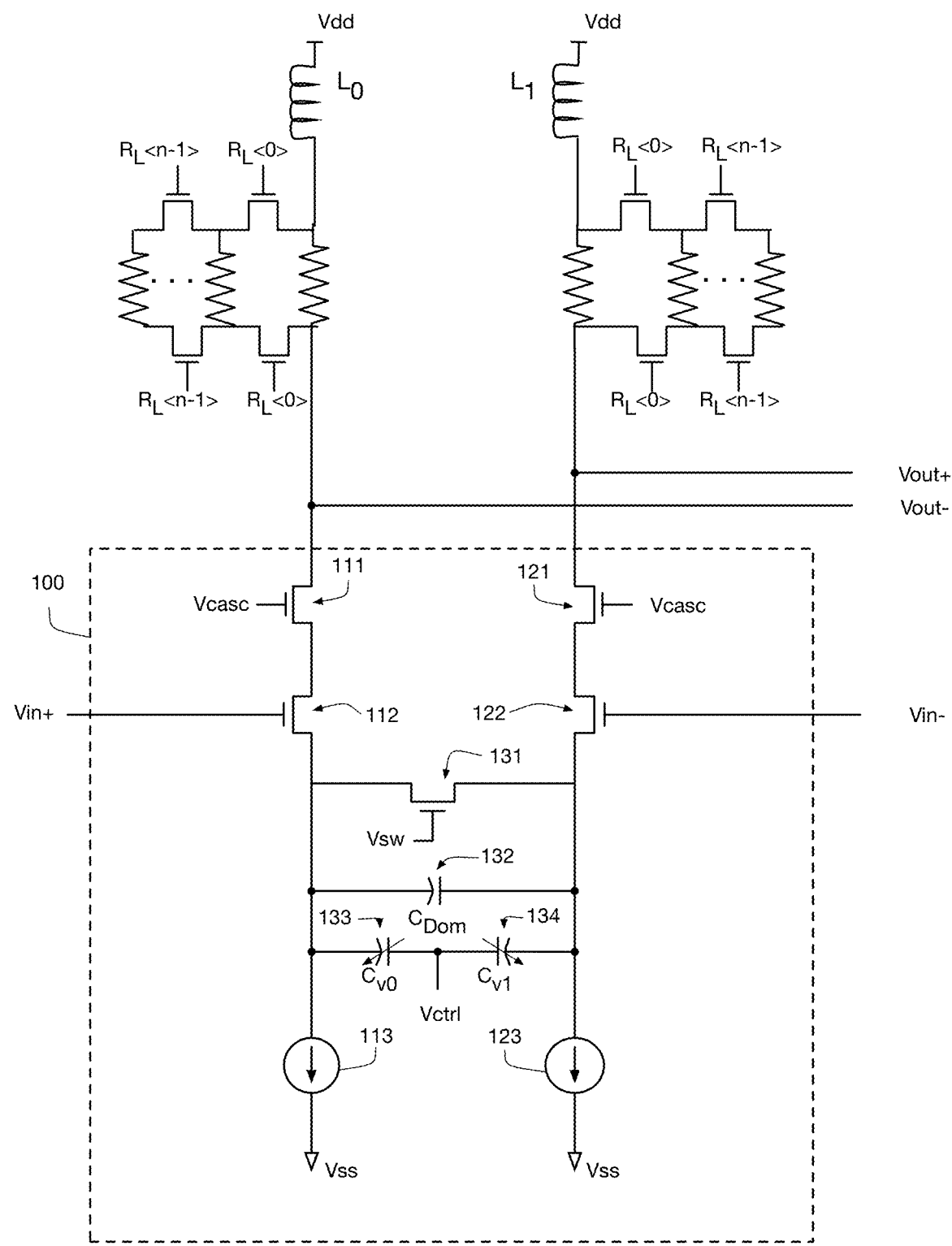
FIG. 1 is a circuit diagram of a CTLE amplifier utilizing NMOS transistors in accordance with some embodiments.
Figure 4:
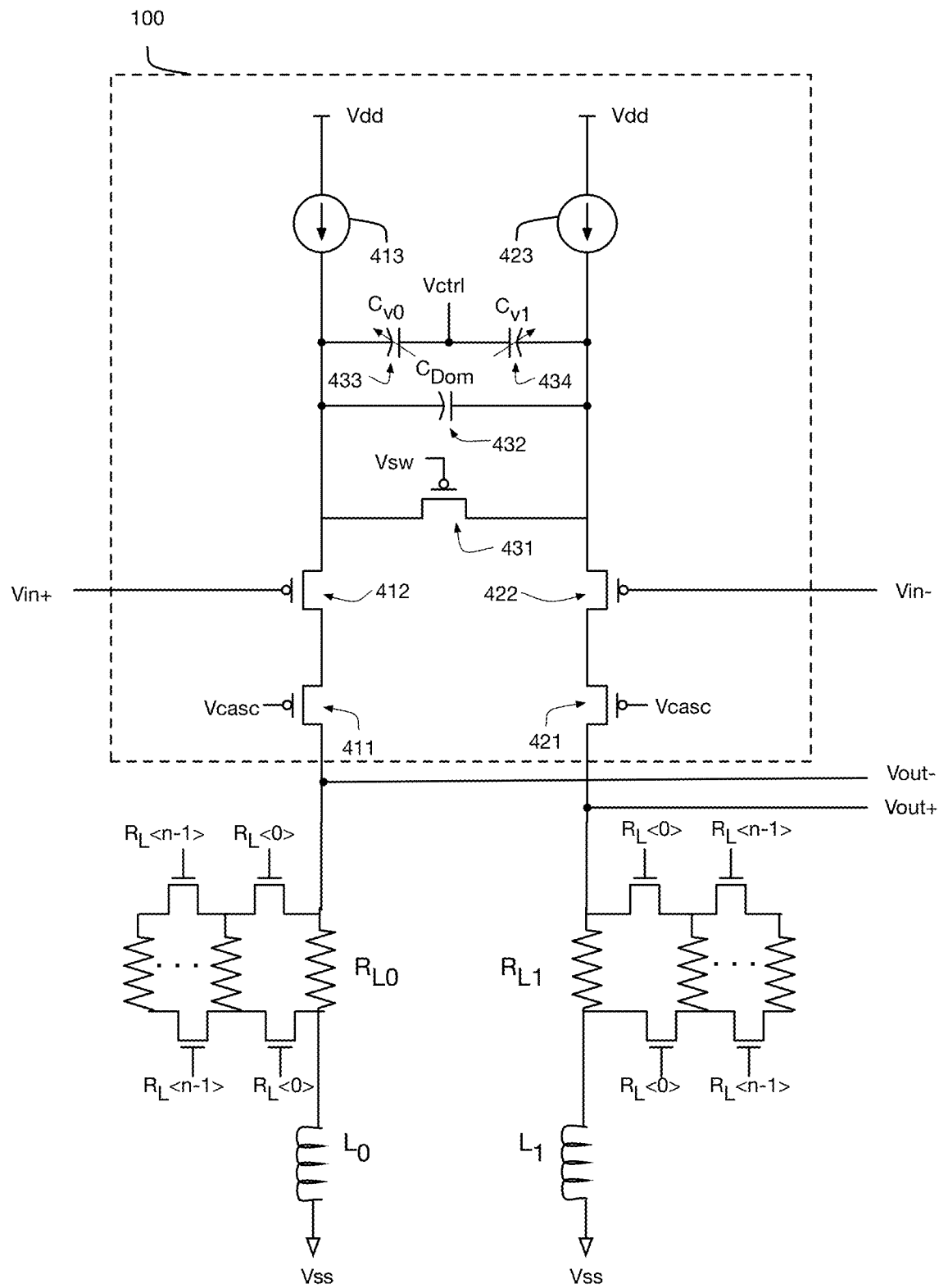
FIG. 4 shows an alternative embodiment of the circuit of FIG. 1 utilizing PMOS transistors.

FIG. 1 shows one embodiment of a configurable CTLE circuit utilizing NMOS transistors as gain elements. An equivalent embodiment utilizing PMOS transistors is shown as FIG. 4. Without implying limitation, reference will be made to the circuit of FIG. 1 in the following descriptions.

It should be noted that these embodiments are intended for use in an integrated circuit environment requiring extremely high frequency signals to be processed with minimal power consumption. The available power rails Vdd and Vss may typically provide one volt or less of operating voltage, thus microampere current flows imply path impedances of many thousands to millions of ohms. As resistances of these magnitudes may require substantial surface area in some integrated circuit processes, active circuit elements such as transistors may be preferable to passive element embodiments.

In FIG. 1, inductive load composed of inductors $L_0$ and $L_1$ shunt peaking at high frequency, allowing a high frequency peaking of more than 10 dB. The corresponding load impedances are provided by resistor arrays generating load impedances $R_{L0}$ and $R_{L1}$. As shown, each resistor array may receive a multi-bit thermometer code load resistance control input $R_L$<n-1:0>, and may selectively connect successive resistors in the parallel network to set a load resistance RL. In some embodiments, adjusting the load resistance may be beneficial to adjust the common mode of the subsequent processing stage, e.g., a variable gain amplifier. Alternatively, load resistance may be adjusted to tweak the magnitude of the high frequency peaking and the location of the second pole of the response, described in more detail below with respect to FIG. 5. As shown in FIG. 1, circuit slice 100 includes transistors 112 and 122 are a matched differential pair, accepting input signals Vin+ and Vin− and producing output signals Vout− and Vout+, respectively. Cascoded transistors 111 and 121, may be configured to receive a gate voltage of Vcasc, and may provide isolation of the input from the output while inherently helping to reduce the input miller capacitance seen at the input. Identical current sources 113 and 123 set the allowable current flow, and may be adjusted to adjust the magnitude of the high frequency peaking, as described below. The source $R_s$ resistance provided by transistor 131 and the capacitance provided by the combination of fixed capacitor 132 and varactor capacitors 133 and 134 determine the frequency-dependent gain characteristics of the equalizer.

In some embodiments, voltage Vsw is configurable, allowing the impedance of transistor 131 to be adjusted. In other embodiments voltage Vsw is fixed, with that voltage and the physical transistor channel dimensions determining the resulting impedance.

In a further embodiment, voltage Vsw may be set to one of two different predetermined values (i.e. a binary selection,) as subsequently described. In one such embodiment, when Vsw causes transistor 131 to be switched "on" (e.g., low impedance), circuit 100 is configured into a first or "flat" operational mode in which the frequency domain zero produced by capacitors 132, 133, 134 is minimized, and the DC equalization is less relative to the peak equalization. Conversely, when Vsw causes transistor 131 to be switched "off" or high impedance, that impedance along with capacitances 132, 133, 134 result in circuit 100 being configured into a second or high frequency "peaking" operational mode, increasing the DC equalization relative to the peaking equalization.

Figure 5:
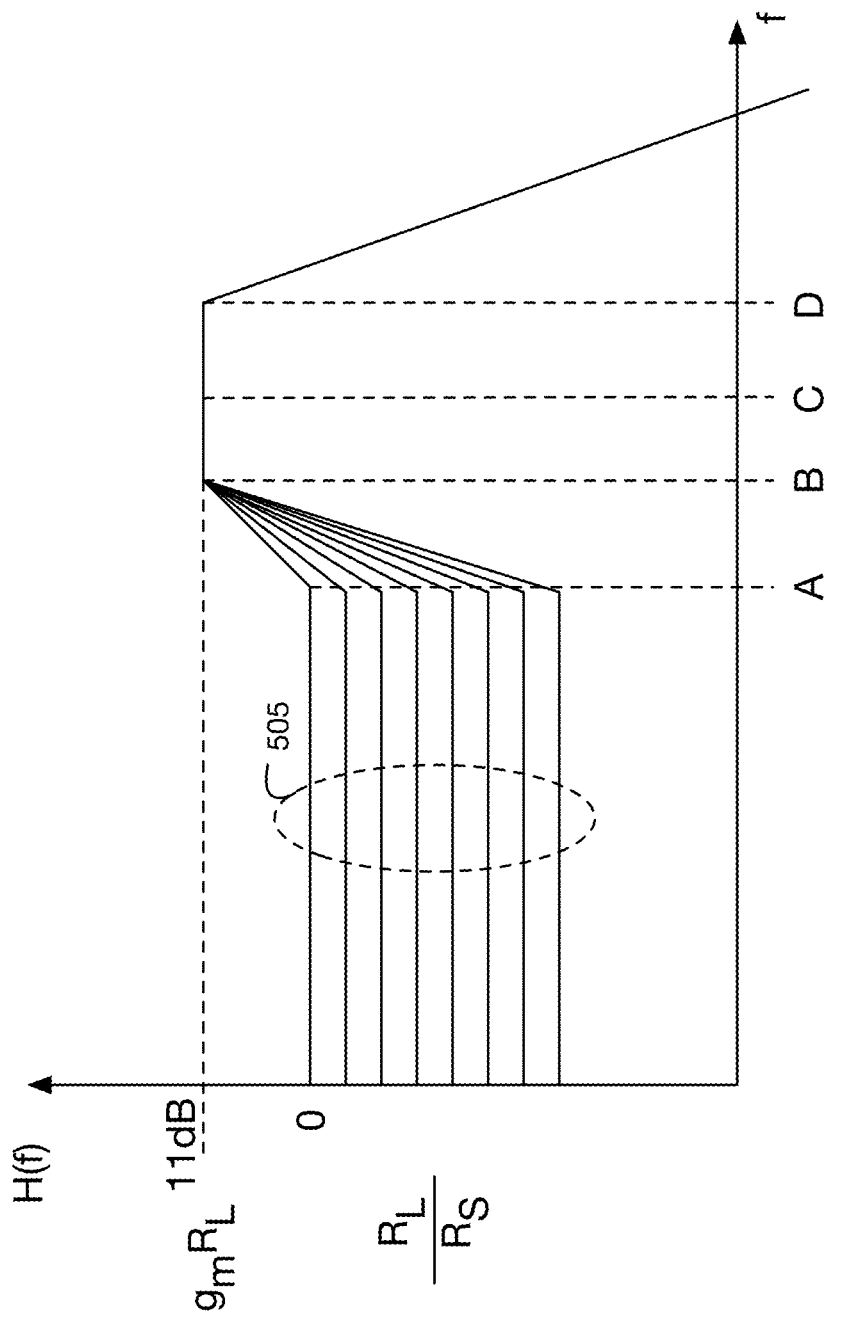
FIG. 5 is a frequency spectrum of an adjustable high frequency peaking CTLE, in accordance with some embodiments.

FIG. 5 illustrates a frequency response of a CTLE providing high-frequency peaking, in accordance with some embodiments. FIG. 5 includes 4 points of interest, first zero A ($w_{zero}$), first pole B ($w_{p0}$), peak frequency C ($w_{peak}$), and second pole D ($w_{p1}$). The values for each point of interest are given in Eqns. 1-4 below:

$$w_{zero} = \frac{1}{R_s C_s}, \quad \text{(Eqn. 1)}$$

where $R_s$ is the source resistance provided by transistor 131, and $C_s$ is the source capacitance, which may be equal $C_{Dom}+C_{vc0/1}$, where $C_{Dom}$ is the dominant capacitance of fixed capacitor 132 and $C_{vc0/1}$ is the capacitance of one of varactor diodes 133 or 134. Here and in the following description, the notation "0/1" may correspond to the value of one element '0' or '1' in the set of {0 1}, as may be common in half circuit analysis. In at least one embodiment, $C_{Dom}$ may have a capacitance of approximately 100 fF in total (e.g., from 20 slices of 100 each having $C_{Dom}$=5 fF), while the varactor diodes 133 and 134 have capacitances ranging approximately from 80-400 fF (e.g., 20 slices of 100 having varactors capacitances ranging from 4 fF-20 fF based on a 0-800 mV Vctrl). Depending on application, the capacitances of the fixed capacitor and varactors may be designed accordingly, e.g., a large fixed capacitance with varactors configured to fine tune via smaller capacitances, or alternatively may be broken up into separate capacitance elements.

The first pole wp0 may be calculated as follows:

$$w_{p0} = \frac{gm_{0/1}}{C_s} \quad \text{(Eqn. 2)}$$

The peak frequency $w_{peak}$ may be calculated as follows:

$$w_{peak} = \frac{1}{\sqrt{L_{Load} C_{Load}}} \quad \text{(Eqn. 3)}$$

and the first zero may be determined as follows:

$$w_{z0} = \frac{1}{R_s C_s} \quad \text{(Eqn. 4)}$$

and the second zero may be determined as follows:

$$w_{z0} = \frac{R_{Load}}{Load} \quad \text{(Eqn. 5)}$$

and finally the dampening factor of the system may be determined as follows:

$$\zeta = \frac{R_{load}}{2} \sqrt{\frac{C_{load}}{L_{load}}} \quad \text{(Eqn. 6)}$$

Figure 6:
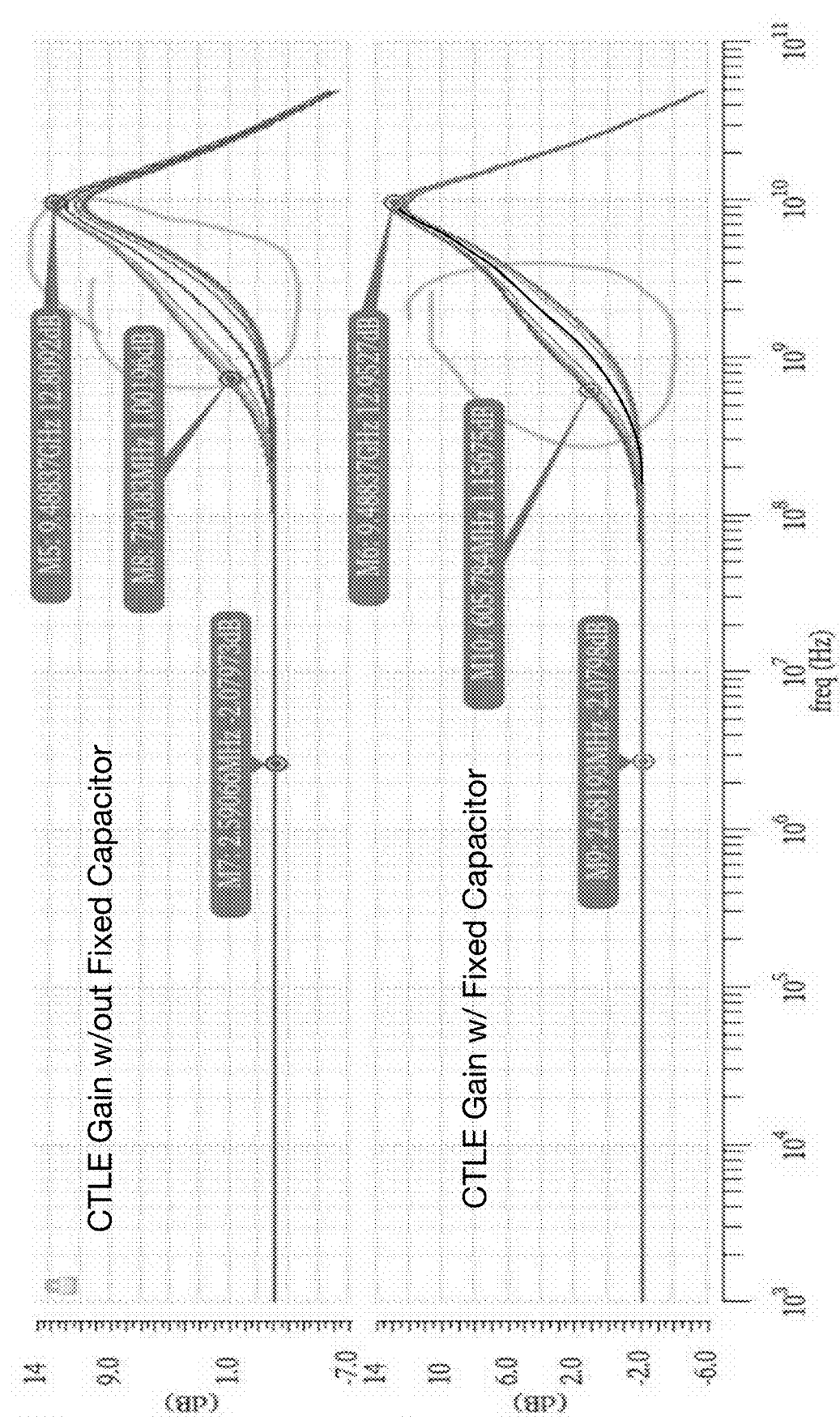
FIG. 6 is a frequency spectrum illustrating CTLE gain without and with a fixed capacitor connected in parallel to varactor capacitors, in accordance with some embodiments.

In some embodiments, capacitances 133 and 134 are provided by voltage-variable capacitors, which may include varactor or other P-N junction diodes, and the voltage-dependent body capacitance of MOS transistor devices whose channels change and are also non-linear and can be a function of time, depending on the manufacturing process used. Charge density in active devices changes over time and is much more noticeable in small channel length devices. As shown, varactors 133 and 134 are connected back-to-back, to minimize the unwanted modulation of the resulting capacitance by signal voltage, with analog control voltage Vctrl used to adjust the overall capacitance. Use of varactors significantly reduces area occupancy on a chip as compared to e.g., a switched capacitor bank. Furthermore, the varactors increase bandwidth and speed, as they do not introduce as much parasitic capacitance as conventional capacitor arrays introduce. Incorporating fixed capacitor 132 in parallel with the variable capacitance of 133 and 134 further reduces these unwanted signal distortion effects due to the varactors described above by reducing the adjustable range to a suitable amount. FIG. 6 includes two frequency spectrums illustrating CTLE gain with respect to frequency. The top graph illustrates tuning the frequency of the first pole by tuning the varactors 133 and 134 without fixed capacitor 132 connected in parallel, and the bottom graph illustrates tuning of the frequency of the first pole by tuning the varactors 133 and 134 with fixed capacitor 132 connected in parallel. As shown, omitting the fixed capacitor 132 results in high non-linearity between tuning steps of the varactor, while including the fixed capacitor 132 makes the curves much more linear. Furthermore, it should be noted that the peak remains more constant when including the fixed capacitor 132. The zero contribution is more constant with fixed capacitor 132 and more towards an expected 20 dB/dec. Without the fixed capacitor 132, the zero changes slope with respect to frequency.

Figure 3A:
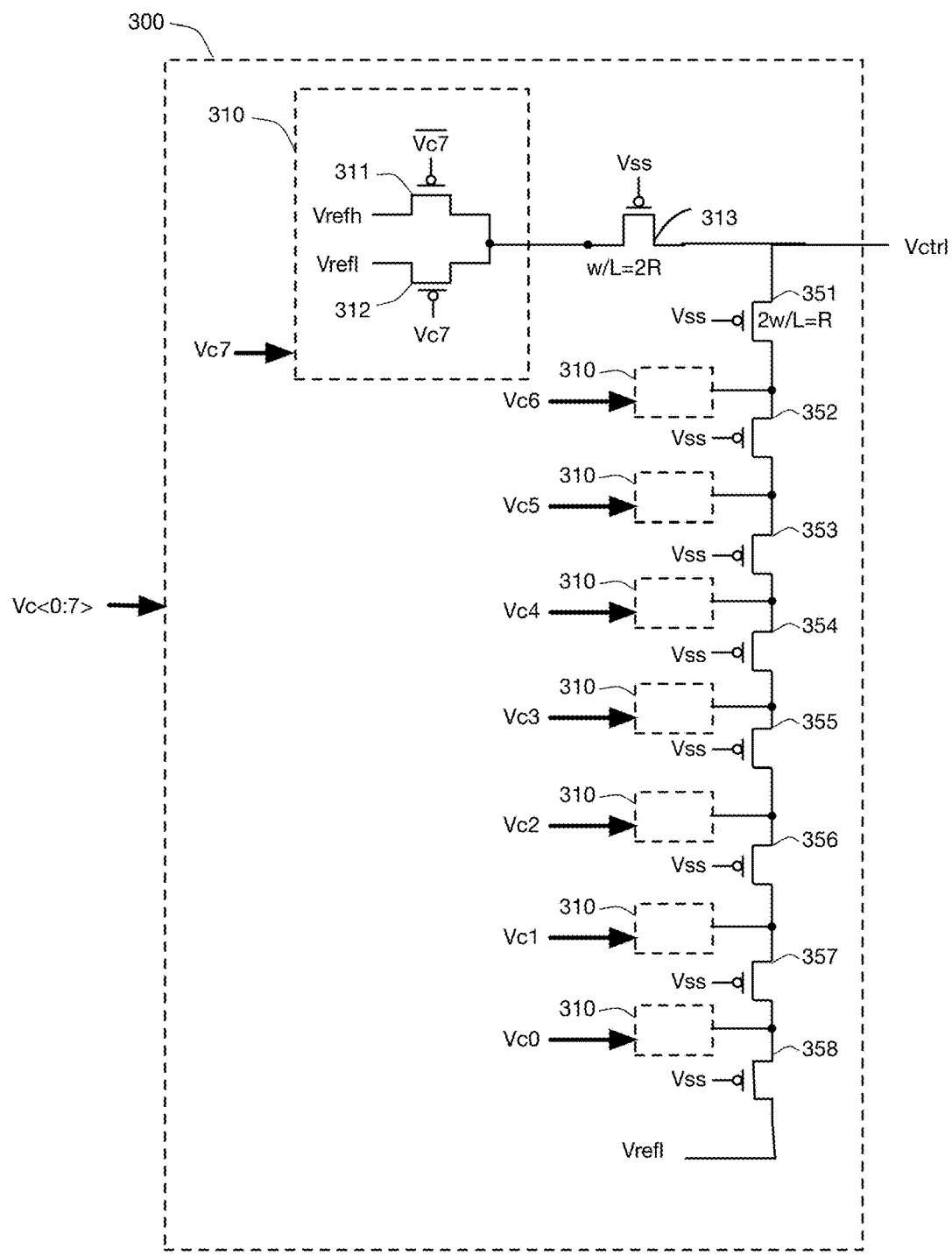
FIG. 3A is a circuit diagram of a digital-to-analog converter utilizing PMOS transistors suitable for use in producing analog control signals, in accordance with some embodiments.

As an added benefit, the capacitance of fixed capacitor 132 may allow use of a MOS ladder DAC, e.g., the MOS ladder DAC of FIG. 3A, which may result in further reduction in power and chip area compared to e.g., a resistor ladder DAC. While MOS ladder DACs may suffer from differential non-linearity (DNL) and integral non-linearity (INL), the fixed capacitor 132 helps eliminate such effects similar to how fixed capacitor eliminates the non-linearity of the varactor diodes. Furthermore, the fixed capacitor may be split into two parts. A source degeneration cap may be used instead of large (or multiple) varactors, which take up a lot of area. In such cases, half the capacitance may be handled by the varactor while the other half may be incorporated using a metal-insulator-metal (MIM) capacitor or a metal over metal (MOM) capacitor. thus, the MIM/MOM capacitors may be vertically stacked in the layers, where the bottom silicon layer contains the varactors while the top metal layers contain the MIM/MOM capacitors. Such capacitors may be useful in applications where a large capacitance is used to move the zero to a smaller frequency.

Figure 2:
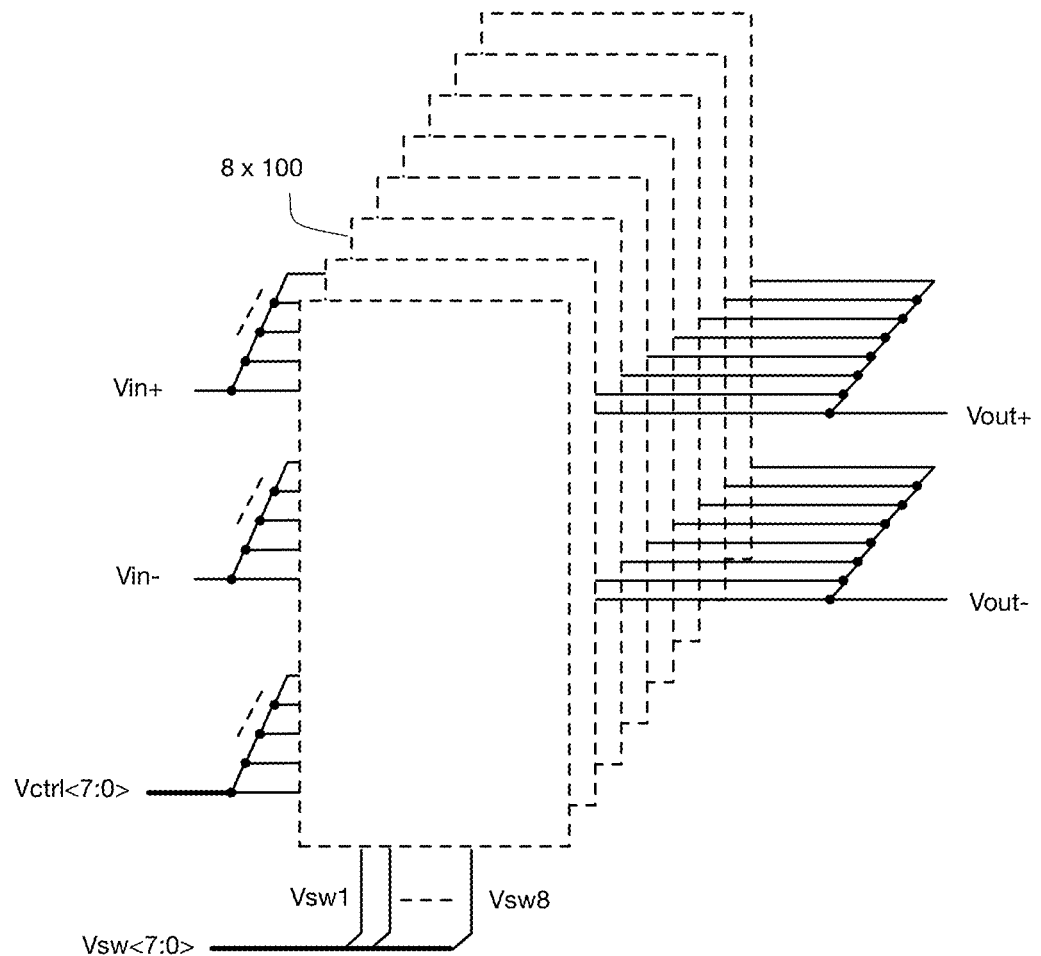
FIG. 2 is a circuit diagram illustrating how multiple instances of an embodiment such as that of FIG. 1 may be combined to provide increased configurability.

FIG. 2 shows a collection of parallel slices of identical CTLE circuits 100 to take advantage of the previously-described binary mode selection by control voltage Vsw. In some embodiments, the parallel slices 100 may each be connected to a common load inductance (e.g., inductors $L_0$ and $L_1$) and load impedance (e.g., load impedances $R_{L0}$ and $R_{L1}$). Without implying limitation, eight slices of circuit 100 are shown, each controlled by a single binary value taken from Vsw<7:0>, which may be considered as a single variable encoded as a "thermometer" or unary count value, from 0 (all low) to 7 (all high). With all instances of transistor 131 controlled by Vsw "open", each instance of circuit 100 will be in its first or "high frequency" operational mode, thus the resulting DC equalization relative to the peak will be at a maximum, and DC gain will be at a minimum. As increasing numbers of Vsw values are set to selectively "short" transistors 131, increasing numbers of 100 instances will enter their second or "wideband" operational mode, resulting in increasing DC gain and thus DC equalization relative to the peak will start to decrease. Finally, with all instances of Vsw "shorted", all instances of 100 will be in their second operational mode, and DC gain will be at a maximum, and DC equalization relative to the peak will be at a minimum. The use of such a parallel-slice configuration to control the DC equalization relative to the peak may reduce wideband noises, e.g., thermal noise, and may introduce less parasitic capacitance.

Figure 7:
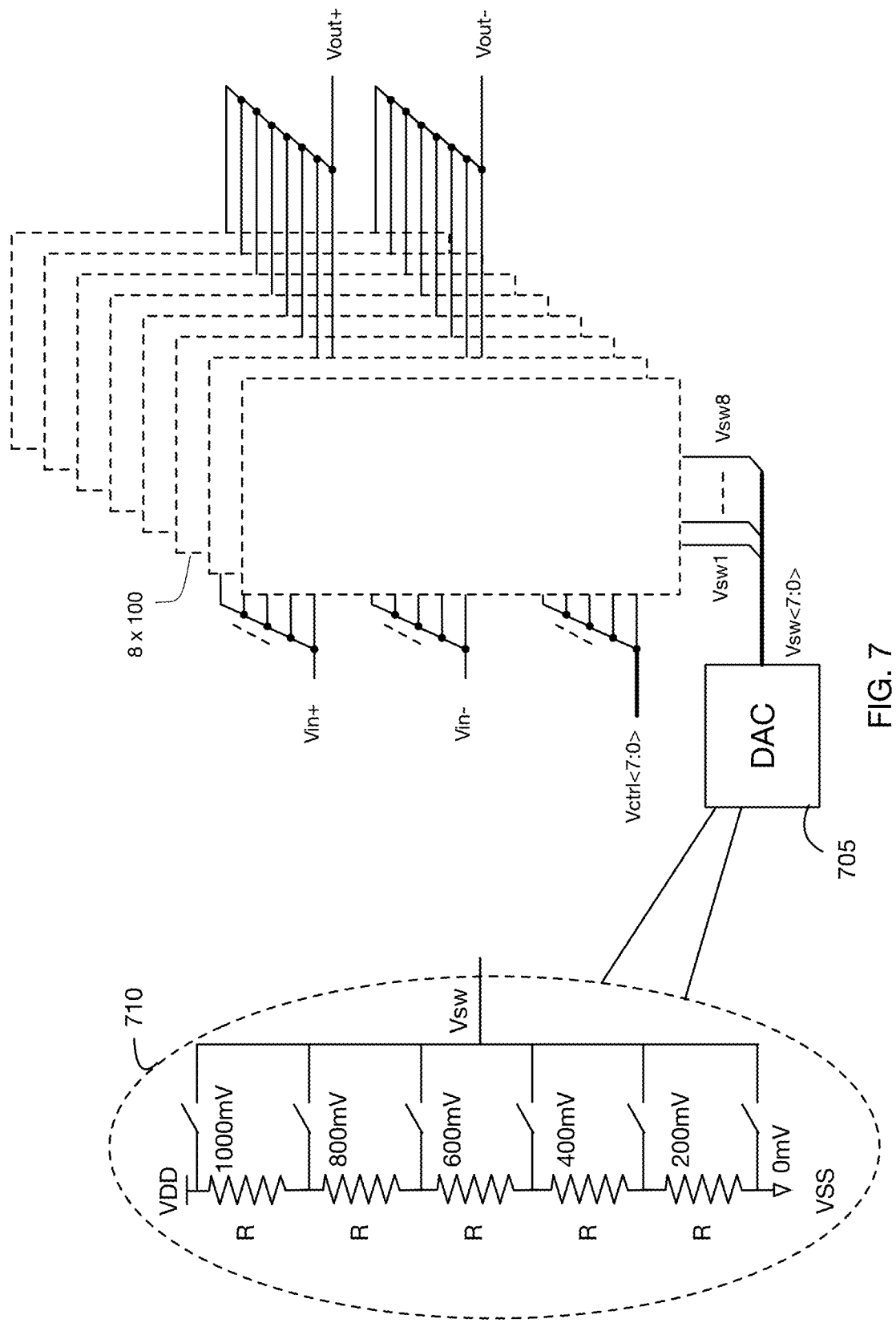
FIG. 7 is a block diagram of a digital-to-analog converter (DAC) circuit generating control signals for setting an equalization range of an Amplifier, in accordance with some embodiments.

In some embodiments, NMOS transistors 131 may be configured to operate in between the "high frequency" and "wideband" operational modes by providing source impedance control signals Vsw<7:0> as inputs to transistors 131 to cause transistors 131 to operate in the linear region. FIG. 7 is a block diagram of a DAC 705 configured to provide multiple voltages of a range of voltages as the source impedance control signals Vsw<7:0>. In FIG. 7, voltages from 0 mV to 1000 mV are provided in 200 mV increments using a resistor-ladder DAC 710, however such numbers should be considered non-limiting, and a DAC 705 may be designed to have any set of values. Further, the DAC 705 should not be considered to be limited to the R-ladder DAC 710 shown; other types of DACs known to those of skill in the art may be used as well.

As one will note, increasing the gate voltage of an NMOS transistor, e.g., via a source impedance control signal Vsw<0> provided to NMOS transistor 131 in FIG. 1, will decrease the channel resistance of transistor 131, thus decreasing the equalization, and vice versa with regards to decreasing the gate voltage to decrease the channel resistance of NMOS transistor 131. Conversely, decreasing the voltage provided to a PMOS transistor, e.g., transistor 431 in FIG. 4, will decrease the channel resistance of PMOS transistor 431, decreasing the equalization, and vice versa with regards to increasing the gate voltage to increase channel resistance of PMOS transistor 431. In such embodiments, the value of the voltage output by the DAC to the transistors 131/431 acts as a "coarse" adjustment to set an equalization range, while the number of enabled parallel slices 100 acts as a "fine" adjustment to finely tune the equalization within the set equalization range.

Figure 8:
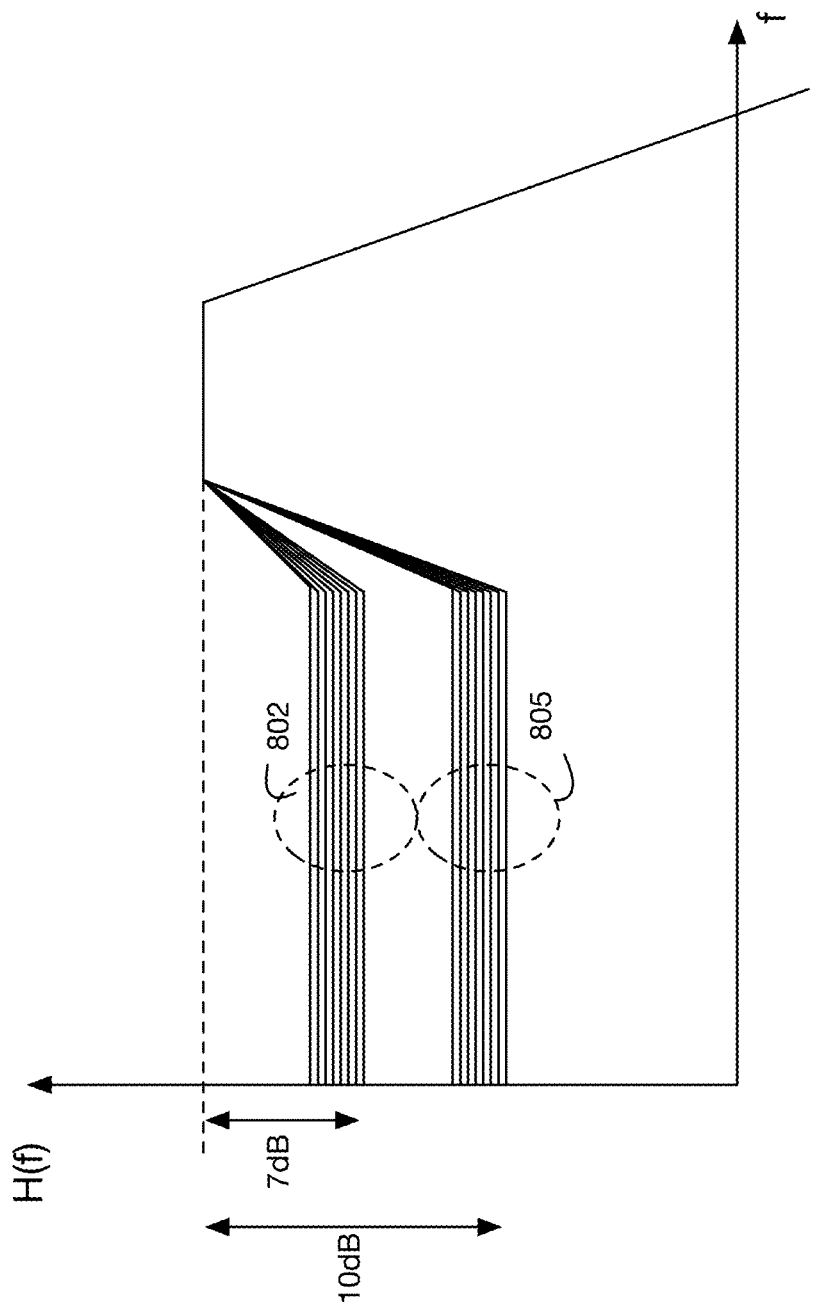
FIG. 8 is a diagram illustrating multiple equalization ranges for different coding schemes, in accordance with some embodiments.

FIG. 8 is a frequency response for two equalization ranges, in accordance with some embodiments. As shown, FIG. 8 includes equalization ranges 802 and 805. In the context of using the NMOS embodiment of FIG. 1, the DAC 705 may be configured to output a relatively higher voltage provided as source impedance control signals Vsw<7:0> to NMOS transistors 131 in enabled parallel slices 100 to configure the amplifier in equalization range 802, and DAC 705 may be configured to output a relatively lower voltage provided as control signals to transistors 131 in enabled parallel slices 100 to configure the amplifier in equalization range 805. Conversely, in the PMOS embodiment, the DAC may be configured to output source impedance control signals having a higher respective voltage to PMOS transistors 431 in enabled parallel slices 100 to set the amplifier in equalization range 802, and a lower respective voltage to the enabled parallel slices 100 to set the amplifier in equalization range 805.

Such embodiments for configuring the amplifier to operate in multiple equalization ranges may accommodate factors including different types of coding schemes, different cable/channel lengths, and/or a combination of various other factors. In one particular example, a non-return to zero (NRZ) coding scheme may be configured to have a max equalization of –7 dB, while an ensemble non-return-to-zero (ENRZ) orthogonal differential vector signaling code scheme may be configured to have a max equalization of ~10 dB. Thus, by selecting an output voltage from the DAC, the correct equalization range may be selected depending on use of ENRZ or NRZ coding schemes, while enabling and disabling parallel slices 100 may finely tune the desired equalization within the selected equalization range.

This configuration of numbers of essentially parallel amplifier slices into a first or a second operational mode provides direct control over the resulting differential gain between the low-frequency and high-frequency regions of the aggregate system's gain-vs-frequency curve. Combined with the previously described control of the variable capacitance elements of each amplifier slice, both the amplitude and corner frequency of the high frequency "peaking" may be configured independently. These adjustments may be combined with other control methods, including varying circuit DC current by adjustment of current sources 113 and 123, and modification of effective load impedance by adjustment of $R_{L0}$ and $R_{L1}$ via the parallel resistor networks controlled by $R_{L<n-1:0>}$. Additionally, the use of multiple parallel slices provides an option to independently control the varactor capacitances in each slice individually, increasing granularity at the cost of a multi-bit control signal Vctrl<7:0>, as shown in FIG. 2. However, some embodiments may provide the same control signal Vctrl to every slice.

Based on Eqns. 1-4 and the descriptions above regarding the varactor diodes for adjusting source capacitance $C_s$ and multiple parallel slice configuration for adjusting source impedance $R_s$, it follows based on the frequency response of FIG. 5 that the circuits of FIGS. 1 and 2 may have multiple degrees of control. The first zero $w_{zero}$ may be controlled by controlling the voltage across the varactors using Vctrl, which adjusts the source capacitance $C_s$. The DC equalization relative to the peak may be controlled by selecting how many parallel slices 100 are switched "off" or "open" (high frequency mode) vs switched "on" or "shorted" (wideband mode). Such adjustments are illustrated in FIG. 5 by the 8 horizontal lines 505. In 505, each horizontal line may correspond to a various step of the 8 steps of the thermometer code described with respect to FIG. 2. As described in FIG. 2, the lowest horizontal line of 505 (e.g., where the DC gain is at a minimum and thus DC equalization relative to the peak is at a maximum) may correspond to the transistors 131 in every slice being switched "off" or "open". Alternatively, every transistor 131 being switched "on" or "shorted" may correspond to the highest horizontal line of 505, indicating that DC gain is at a maximum, and thus DC equalization relative to the peak is at a minimum. Further, the second pole $w_{p1}$ of the frequency response may be adjusted by adjusting the effective load impedance via load resistors $R_{L0}$ and $R_{L1}$. In some embodiments, the effective load impedance may be set via tunable resistors (not shown). Having adjustment of the zero and pole allows adjustment of the desired frequency band (width and location) of the high frequency peaking, as well as the gain of the high frequency peaking. Such embodiments are useful in backwards compatibility with some legacy designs, as well as dynamic adjustment in response to changes in channel response. Another degree of control may correspond to adjusting bias current in current sources 113 and 123, which may control the magnitude of the peak by increasing or decreasing gm. Further, the common mode provided to the following signal processing stage may be adjusted by controlling the load impedances $R_{L0}$ and $R_{L1}$, e.g., via the resistor banks shown in FIG. 1.

Adjustment of these various configurable elements may utilize multiple control elements, such as digital-to-analog converters (DACs), that increase system power consumption and layout area. FIG. 3A shows an embodiment of a PMOS-ladder DAC optimized for minimal integrated circuit area and low current utilization. In some embodiments, the PMOS-ladder DAC is well-suited with the PMOS circuit of FIG. 4, as the PMOS-ladder DAC may utilize the same substrate that circuit 100 is disposed on, resulting in significant savings in overall circuit area. As fixed value resistors may occupy significant layout area in some integrated circuit processes, the channel resistance of PMOS transistors are used instead, as seen at 351 through 358. In a practical embodiment, all of 351-358 will be identical PMOS transistors, designed with sufficiently narrow channels to provide the desired series resistance or "R" value in a conventional R-2R ladder structure. In such embodiments, the ratio of the width-to-length (W/L) of transistors 351-358 may be twice the W/L ratio of transistor 313, resulting in a halved resistance 'R', as increasing width with respect to length reduces the resistance. In some embodiments, gate bias Vss is applied to insure each such transistor is in its resistive channel state.

Each driving element 300 for the ladder, corresponding to a switch-selected voltage source in series with a "R" resistance transistors 351-358, the exception being transistor 313 having resistance 2R, is shown as a MUX composed of two identical MOS transistors 311 and 312, with 311 selecting voltage Vrefh and 312 selecting voltage Vrefl, the desired high and low values for the DAC output range. In some embodiments, transistor 313 will have a channel resistance twice that of transistors 351-358. In some embodiments, the Vrefh and Vrefl may range from 700-900 mV. In embodiments utilizing NMOS transistors, the voltage range may be lower, e.g., 0-200 mV, as NMOS transistors are more proficient in passing lower voltages.

Transistors 311 and 312 are driven by complementary control signals, here shown as derived from binary control input Vc7, one value taken from control word Vc<0:7> and the other the inverted version of VC7, $\overline{VC7}$. In the example of FIG. 3A, eight instances of 310 are used to drive the eight ladder taps, thus the binary control input for each instance is derived from a different bit value in control word Vc<0:7>, with Vc7 controlling the most-significant bit of the ladder, and Vc0 controlling the least-significant bit. In some embodiments, the values in control word Vc<0:7> are differential, thus for example control value Vc7 is inherently available as both Vc7 and its compliment $\overline{VC7}$, which may directly control transistors 311 and 312. In other embodiments, each instance of 310 incorporates buffer/inverter gates to provide the appropriate drive signals to 311 and 312 from a single digital control value.

In one particular integrated circuit embodiment, DAC 300 producing analog output Vctrl was sufficiently compact to be physically collocated with or near the variable capacitance diodes 133 and 134 it controlled, minimizing the introduction of unwanted parasitic loads into analog circuit 100.

Figure 3B:
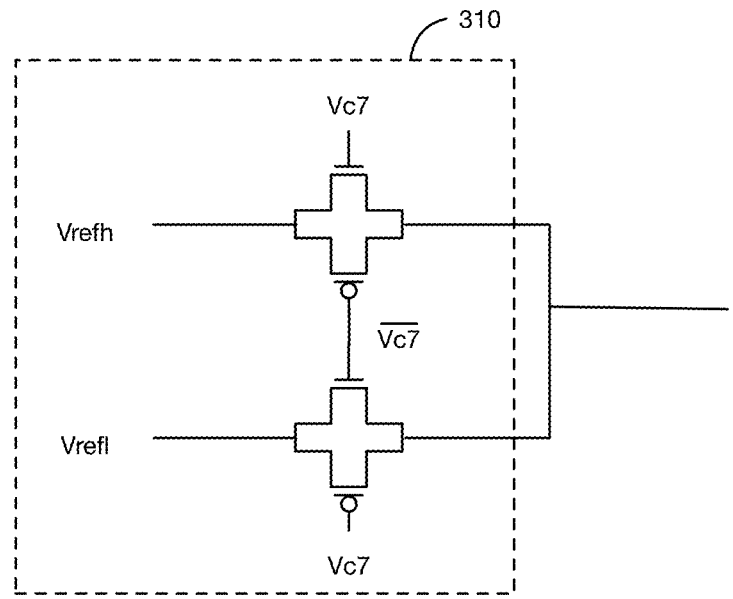
FIG. 3B is a circuit diagram including transmission gate implementations of the transistors shown in FIG. 3A.
Figure 3B:
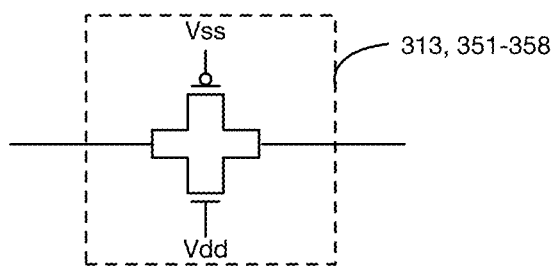

Although PMOS transistors are shown in FIG. 3A, an equivalent embodiment may be produced using NMOS transistors. Such single-transistor embodiments may be useful for implementations outputting a narrow range of voltages near Vss (e.g., 0-200 mV) for NMOS designs, and voltages near Vdd (e.g., 700-900 mV) for PMOS designs. In the above described embodiments, the varactors may respond particularly well to the control voltages provided near Vdd, however such embodiments should not be considered limiting. Depending on the relative voltages of Vrefh and Vrefl compared to Vdd, Vss, and the particular transistor gate thresholds, NMOS, PMOS, or even hybrid embodiments in which MUX structures 310 are implemented using transmission gates may be desirable. Such an embodiment in which MUX elements 310, and transistor elements 313 and 351-358 are Tx gates is shown in FIG. 3B. FIG. 3B includes a MUX element 310 utilizing Tx gates, where the selection inputs Vc7 and $\overline{VC7}$ control NMOS and PMOS transistors connected to Vrefh, respectively, and control PMOS and NMOS transistors connected to Vrefl, respectively. In transistor circuit 313, an NMOS connected to Vdd and a PMOS connected to Vss are connected in parallel. In such embodiments utilizing Tx gates, the NMOS transistor is proficient in passing lower voltages whereas the PMOS transistor is proficient in passing higher voltages. Such embodiments may increase the voltage range provided at Vrefh and Vrefl. Whereas the PMOS only MOS ladder may receive a range of 700-900 mV, the Tx gate version may receive a range of 0-900 mV.

While MOS ladder DACs may provide significant advantages in terms of power savings and chip area savings, it should be noted that other DACs, e.g, R-2R ladders utilizing resistors instead of transistors may be utilized as well to provide the various control signals.

We claim:

1. A method comprising:
   receiving a differential input signal at a plurality of differential pairs, and responsively generating an amplified output signal on a pair of output nodes, each differential pair having a corresponding tunable source impedance;
   generating an analog voltage to set fine and coarse settings of a direct-current (DC) gain applied to the differential input signal, wherein the coarse setting of the DC gain is associated with a value of the analog voltage;
   providing the analog voltage to the tunable source impedance of a selectable number of differential pairs according to a thermometer code to configure the selectable number of differential pairs in a wideband mode of operation, wherein the fine setting of the DC gain is determined by the selectable number of differential pairs receiving the analog voltage; and
   setting the corresponding tunable source impedances of all remaining differential pairs in an open-circuit configuration to configure the remaining differential pairs in a peaking mode of operation.

2. The method of claim 1, wherein the analog voltage is generated using a digital-to-analog converter (DAC).

3. The method of claim 1, further comprising controlling a tunable capacitance connected in parallel with the tunable source impedance.

4. The method of claim 3, wherein controlling the tunable capacitance comprises providing a control signal to two varactor diodes connected in parallel to a fixed capacitor.

5. The method of claim 4, wherein the control signal is generated using a metal-oxide semiconductor (MOS) ladder digital-to-analog converter (DAC).

6. The method of claim 1, further comprising adjusting a shared tunable load impedance connected to the plurality of differential pairs.

7. The method of claim 1, wherein the fine and coarse settings of the DC gain are determined based in part on a plurality of coding schemes associated with the differential input signal.

8. The method of claim 7, wherein the plurality of coding schemes comprises an ensemble non-return-to-zero (ENRZ) coding scheme.

9. The method of claim 1, wherein each corresponding tunable source impedance of the selectable number of differential pairs is a transistor biased into a linear region by the analog voltage.

10. The method of claim 1, wherein the analog voltage is provided to up to 20 differential pairs.

11. An apparatus comprising:
a plurality of differential pairs connected in parallel to a pair of output nodes, the plurality of differential pairs configured to receive a differential input signal and to responsively generate an amplified output signal on the pair of output nodes;
each differential pair of the plurality of differential pairs having a corresponding tunable source impedance for setting DC gain relative to a high-frequency peak amplification of the amplified output signal; and
a control signal generator having a plurality of output taps connected to corresponding tunable source impedances, the control signal generator configured generate an analog voltage on a selectable number of the plurality of output taps in accordance with a thermometer code, wherein the selectable number of output taps sets a fine setting of the DC gain and wherein a value of the analog voltage sets a coarse setting of the DC gain.

12. The apparatus of claim 11, wherein the control signal generator is a digital-to-analog converter (DAC).

13. The apparatus of claim 11, wherein each differential pair further comprises a corresponding tunable capacitance connected in parallel with the tunable source impedance.

14. The apparatus of claim 13, wherein the tunable capacitance comprises two varactor diodes connected in parallel to a fixed capacitor, the two varactor diodes configured to receive a control signal.

15. The apparatus of claim 11, wherein the plurality of differential pairs are connected to a shared tunable load impedance.

16. The apparatus of claim 11, wherein the control signal generator is configured to configure the fine and coarse settings of the DC gain based on a plurality of coding schemes associated with the differential input signal.

17. The apparatus of claim 16, wherein the plurality of coding schemes comprise an ensemble non-return-to-zero (ENRZ) coding scheme.

18. The apparatus of claim 11, wherein each corresponding tunable source impedance is a transistor biased into a linear region by the analog voltage.

19. The apparatus of claim 11, wherein the plurality of differential pairs comprises at least 20 differential pairs.

20. The apparatus of claim 11, wherein the control signal generator configures the corresponding tunable source impedances of a subset of the plurality of differential pairs to be an open circuit via all remaining taps of the plurality of output taps.

* * * * *